United States Patent [19]
Nishikawa et al.

[11] Patent Number: 5,661,437
[45] Date of Patent: Aug. 26, 1997

[54] NEGATIVE FEEDBACK VARIABLE GAIN AMPLIFIER CIRCUIT

[75] Inventors: Kenjiro Nishikawa; Tsuneo Tokumitsu, both of Yokosuka, Japan

[73] Assignee: Nippon Telegraph and Telephone Corporation, Tokyo, Japan

[21] Appl. No.: 514,381

[22] Filed: Aug. 11, 1995

[30] Foreign Application Priority Data

Aug. 15, 1994 [JP] Japan ................. 6-191646

[51] Int. Cl.⁶ .......................... H03G 3/30; H03F 1/34
[52] U.S. Cl. .......................... 330/282; 330/294
[58] Field of Search .................. 330/86, 110, 282, 330/285, 294

[56] References Cited

U.S. PATENT DOCUMENTS

| | | | |
|---|---|---|---|
| 5,015,968 | 5/1991 | Podell et al. | 330/294 X |
| 5,051,705 | 9/1991 | Moghe et al. | 330/282 X |
| 5,264,806 | 11/1993 | Kobayashi | 330/294 |
| 5,371,477 | 12/1994 | Ikeda et al. | 330/282 |

FOREIGN PATENT DOCUMENTS

| | | | |
|---|---|---|---|
| 4238407 | 8/1992 | Japan | 330/282 |
| 4357706 | 12/1992 | Japan | 330/282 |
| 543133 | 2/1977 | U.S.S.R. | |

OTHER PUBLICATIONS

Ishihara et al; "9GHz Bandwidth, 8–20dB Controllable–Gain Monolithic Amplifier . . . "; Electronics Letters, vol. 25, No. 19, Sep. 14, 1989, pp. 1317–1318.

Nishikawa et al; "An MMIC Low–Distortion Variable–Gain Amplifier . . . "; 1994 Asia Pacific Microwave Conference; pp. 245–248.

Nishikawa et al; "An MMIC Low–Distortion Variable–Gain Amplifier . . . "; 1995 IEEE MTT-S Digest; pp. 1619–1622.

Primary Examiner—Steven Mottola
Attorney, Agent, or Firm—Spencer & Frank

[57] ABSTRACT

A variable gain amplifier circuit in which a feedback circuit that feeds back the output signal of an amplifier from its output terminal to its input terminal is composed of an FET. The gate terminal of the feedback FET is connected to the output terminal of the amplifier through a capacitor, and the source terminal of the feedback FET is connected to the input terminal of the amplifier. The gain of the amplifying circuit is controlled by varying the transconductance of the feedback FET by controlling a bias voltage applied to the gate or drain terminal of the feedback FET. This makes it possible to control the gain independently of the physical dimension of the feedback FET, and at the same time, to prevent the input signal from being transmitted from the input side to the output side through the feedback circuit.

21 Claims, 17 Drawing Sheets

CHARACTERISTICS OF AMPLIFIER
CIRCUIT 70
(CONSTANT OUTPUT)

CHARACTERISTICS OF AMPLIFIER
CIRCUIT 70
(MINIMUM GAIN)

1

NEGATIVE FEEDBACK VARIABLE GAIN AMPLIFIER CIRCUIT

BACKGROUND OF THE INVENTION

1. Field of the Invention

The present invention relates to a negative feedback variable gain amplifier circuit preferably used in AGC (Automatic Gain Control) circuits of wireless receivers or the like.

2. Description of Related Art

Recently, with the development of radiophones or the like, wide dynamic range, high linearity variable gain amplifier circuits have been urgently required which convert a received signal of dynamically varying amplitude into a signal of nearly a constant level.

FIG. 1 shows a conventional negative feedback amplifier circuit. The negative amplifier circuit includes an amplifier 1, and a feedback circuit 3 consisting of a capacitor 3a and a resistor 3b. An input matching circuit 7 is connected between the amplifier 1 and an input port 5, and an output matching circuit 9 is connected between the amplifier 1 and an output port 11.

The feedback circuit 3 presents a problem in that it transmits an input signal from the input side to the output side of the amplifier 1 because of its reciprocal characteristic. In particular, the problem becomes serious when the gain of the amplifier 1 is less than unity, in which the effect of the transmitted signal component on the output side increases through the feedback circuit 3.

FIGS. 2 and 3 show conventional variable gain amplifier circuits. The variable gain amplifier circuit of FIG. 2 employs a dual gate FET 21 as an amplifier, and utilizes one of the dual gate terminals as a control port 23 to implement a variable gain amplifier circuit. In addition, a gate bias voltage Vg is applied to the gate terminal of an FET constituting the input matching circuit 7 through a gate bias port 27, and a drain bias voltage Vdd is applied to the drain terminal of an FET constituting the output matching circuit 9 through a drain bias port 29.

The variable gain amplifier circuit of FIG. 3 has a cascode amplifier composed of FETs 31 and 33, and uses the gate terminal of the FET 33 as a control port 35, thereby implementing a variable gain amplifier circuit. The variable gain amplifier circuits of FIGS. 2 and 3 are equivalent in that the transconductances of the FETs are changed to control their gains.

In FIG. 3, when the gain of the amplifier circuit must be increased to amplify a low level input signal, the transconductance $g_m$ of the FET 31 is increased by applying a larger percentage of the voltage across FETs 31 and 33 between the drain of FET 31 and ground. This is achieved by applying a positive voltage to the control port 35. In contrast with this, when the gain of the amplifier circuit must be decreased to amplify (attenuate) a high level input signal, the transconductances $g_m$ of the FETs 31 and 33 are reduced. This is achieved by applying a negative voltage to the control port 35, thereby reducing the voltage between the drain of the FET 31 and ground, and increasing the a reverse bias between the source and gate of the FET 33.

Generally, the linearity of an FET is considerably degraded with the reduction of its transconductance. As a result, in the variable gain amplifier circuit which varies its gain by changing the transconductances of the FETs, the amplitude of the FET 31 sharply drops and the linearity of the FET 33 is considerably degraded during the low gain operation. This poses a problem in that the maximum allowable input level to the amplifier circuit drops as the gain is reduced in response to a large amplitude input signal. In other words, it has a drawback in that its low distortion range is narrow.

FIG. 4 shows an amplifier circuit developed for solving the drawbacks of the foregoing variable gain amplifier circuits, which was presented in the IEEE MTT-S International Microwave Symposium in 1991. This amplifier circuit employs a common source FET 41 as an amplifier, and a serial circuit of a capacitor 43a and an FET 43b as a feedback circuit. The gate terminal of the FET 43b is grounded through a bypass capacitor 45, and is connected to a control port 47. The gain of the amplifier circuit is controlled by varying the resistance across the drain and source of the FET 43b.

According to this variable gain amplifier circuit, since the drain bias voltage of the FET 41 which operates as an amplifier is kept constant, the low distortion range increases as compared with the variable gain amplifier circuit of FIG. 3. In addition, the input impedance of the amplifier is decreased as the drain-source resistance of the FET 43b is reduced to drop the gain of the amplifier in response to an increase in the amplitude of the input signal. Thus, the voltage level applied to the gate of the FET 41 is suppressed, and hence the maximum allowable input level can be increased.

It is important for the variable gain amplifier circuit to vary its input impedance in a wider range to accomplish a low distortion operation up to a larger input signal level.

FIG. 5 illustrates the relationship between the gate control voltage and the drain-source resistance Rds of the feedback FET 43b of FIG. 4. The gate width of the FET 43b is 100 µm. In this case, the minimum resistance of the FET 43b is several tens of ohms. As a result, the minimum gain of the amplifier circuit of FIG. 4 is limited to approximately −10 dB. To further decrease the minimum gain of the amplifier circuit, it is necessary to further reduce the drain-source resistance of the feedback FET 43b. For this purpose, the gate width of the FET 43b must be widened. This, however, presents another problem in that the parasitic capacitance increases, and this degrades the performance of the amplifier (that is, the gain-bandwidth product).

FIG. 6 shows another conventional feedback amplifier circuit which is disclosed in SU543133. The amplifier circuit comprises a two-stage amplifier including transistors 51 and 53, and a feedback transistor 52. The base of the feedback transistor 52 is connected to the collector of the output transistor 53 through a resistor 54, and to the base of the output transistor 53 through a capacitor 55. The emitter of the feedback transistor 52 is connected to the base of the output transistor 53 through a resistor 56. An unstable voltage component at the collector of the output transistor 53 causes a current in the base of the feedback transistor 52 through the resistor 54. The current is amplified by the feedback FET 52, and is supplied to the base of the output transistor 53 through the resistor 56, thereby compensating for the instability of the collector. Thus, the output loss of the output transistor 53 is reduced, and the maximum output signal is increased.

In the negative feedback amplifier circuit of FIG. 6, however, the output transistor 53 and the feedback transistor 52 are integrated, and cannot be controlled independently. Therefore, the gain of the amplifier circuit cannot be varied externally.

FIG. 7 shows still another negative feedback amplifier circuit by Kobayashi, which is disclosed in U.S. Pat. No.

5,264,806. The amplifier circuit includes a Darlington amplifier 62 and an active feedback circuit 64. The active feedback circuit 64 includes a transistor QF, and resistors Rte and Rbt. The base of the transistor QF is connected to the output terminal of the Darlington amplifier 62 via the resistor Rbt, and the emitter thereof is connected to the input terminal of the Darlington amplifier 62 through the resistor RF. In this amplifier circuit, it is possible to vary the inductance of the active feedback circuit 64 by changing the resistances of the resistors Rbt and Rte, thereby varying the bandwidth of the amplifier circuit. The transistor QF of the active feedback circuit 64, however, cannot operate independently of the Darlington amplifier 62. Accordingly, the gain of the amplifier cannot be controlled externally.

FIG. 8 shows a conventional negative feedback variable gain amplifier circuit presented in Electronics Letters, 14th Sep., 1989, Vol. 25, No. 19, pp. 1317–1318. The amplifier circuit is a differential amplifier. In this figure, major amplifying portions comprise transistors Q1 and Q2, and each of the transistors Q3 constitutes a negative feedback circuit. Specifically, the base of each of the feedback transistors Q3 is connected to the output terminal of one of the output transistors Q2, and the emitter of each of the feedback transistors Q3 is connected to the input terminal of one of the output transistors Q2 via a resistor RL1. Using the transistors Q3 as the feedback circuits makes it possible to widen the bandwidth of the variable gain amplifier circuit. In addition, the variable gain amplifier circuit varies its gain by changing the transconductance of the transistor Q1.

In the negative feedback variable gain amplifier circuit, however, the feedback transistors Q3 cannot operate independently of the major amplifying portion, and hence gain control by controlling the feedback amount is impossible. Furthermore, since the gain is controlled by varying the transconductance of the transistor Q1 in the major amplifying portion, it has the above-mentioned drawbacks. That is, the amplification factor of the transistor Q1 is sharply reduced and linearity thereof is considerably degraded when the gain of the variable gain amplifier circuit is low. Thus, the amplifier circuit has drawbacks in that the maximum allowable input level for low-distortion operation is rather low because it is reduced with a decrease in the gain.

In summary:

(1) The maximum allowable input level is limited in the variable gain amplifier circuits shown in FIGS. 2 and 3 because of the poor linearity of their amplifiers.

(2) The maximum allowable input level is limited in the variable gain amplifier circuit shown in FIG. 4 because of the physical dimension of the FETs constituting the variable gain amplifier circuit.

(3) The gain cannot be controlled in the negative feedback amplifier circuits shown in FIGS. 6 and 7, because the feedback transistors cannot operate independently of the major amplifying portions.

(4) The gain cannot be controlled in the negative feedback variable gain amplifier circuit shown in FIG. 8, because the feedback transistor cannot operate independently of the major amplifying portion. In addition, the maximum allowable input level is limited because of the poor linearity of the amplifier.

SUMMARY OF THE INVENTION

It is therefore an object of the present invention to provide a negative feedback variable gain amplifier circuit with a high linearity and a large maximum allowable input level.

Another object of the present invention is to provide a negative feedback variable gain amplifier circuit that can prevent an input signal from being transferred from the input side to the output side through a feedback circuit.

In a first aspect of the present invention, there is provided a negative feedback variable gain amplifier circuit comprising:

an amplifier for amplifying an input signal;

a first port to which a first voltage is applied;

a second port to which a second voltage is applied;

a feedback transistor whose control terminal is connected to the first port, whose first main current terminal is connected to an input terminal of the amplifier, and whose second main current terminal is connected to the second port; and a capacitor connected between an output terminal of the amplifier and the control terminal of the feedback transistor, wherein the negative feedback variable gain amplifier circuit varies its gain in response to at least one of the first voltage and the second voltage.

The negative feedback variable gain amplifier circuit may further comprise:

means for measuring power of an input signal to the negative feedback variable gain amplifier circuit, and for outputting a detection signal indicative of the power;

a control circuit for outputting the first voltage in response to the detection signal; and a fixed voltage source for outputting the second voltage.

The negative feedback variable gain amplifier circuit may further comprise:

a fixed voltage source for outputting the first voltage;

means for measuring power of an input signal to the negative feedback variable gain amplifier circuit, and for outputting a detection signal indicative of the power; and a control circuit for outputting the second voltage in response to the detection signal.

The negative feedback variable gain amplifier circuit may further comprise:

means for measuring power of an input signal to the negative feedback variable gain amplifier circuit, and for outputting a detection signal indicative of the power; and a control circuit for outputting the first voltage and the second voltage in response to the detection signal.

At least one of the first port and the second port may be grounded through a capacitor.

The amplifier may be a cascode amplifier.

The amplifier may be a multi-stage amplifier.

The feedback transistor may be an FET (Field Effect Transistor), wherein the control terminal is a gate terminal of the FET, the first main current terminal is a source terminal of the FET, and the second main current terminal is a drain terminal of the FET.

The feedback transistor may be a bipolar transistor, wherein the control terminal is a base terminal of the bipolar transistor, the first main current terminal is an emitter terminal of the bipolar transistor, and the second main current terminal is a collector terminal of the bipolar transistor.

The feedback transistor may be a hetero-junction transistor, wherein the control terminal is a base terminal of the hetero-junction transistor, the first main current terminal is an emitter terminal of the hetero-junction transistor, and the second main current terminal is a collector terminal of the hetero-junction transistor.

In a second aspect of the present invention, there is provided a negative feedback amplifier circuit comprising:

an amplifier for amplifying an input signal;

a capacitor whose first terminal is connected to an output terminal of the amplifier; and a feedback transistor whose control terminal is connected to a second terminal of the capacitor, whose first main current terminal is connected to an input terminal of the amplifier, and whose second main current terminal is grounded in terms of alternate current.

The negative feedback variable gain amplifier circuit in accordance with the present invention controls the feedback amount by varying the transconductance of the feedback transistor. This makes it possible to implement a variable gain amplifier circuit independent of the physical dimension of the amplifying transistor. Specifically, it reduces its gain by increasing the feedback amount by increasing the transconductance of the feedback transistor for a large amplitude input signal. Conversely, it increases its gain by decreasing the feedback amount by reducing the transconductance of the feedback transistor for a small amplitude input signal. Thus, a signal with its amplitude level regulated is outputted.

In this case, the input impedance of the feedback transistor, that is, the impedance of the feedback transistor as seen by looking into the control terminal of the transistor (the gate of an FET, or the base of a bipolar transistor) is kept at a high, approximately constant value. On the other hand, the output impedance of the feedback transistor, that is, the impedance of the feedback transistor as seen by looking into the main current terminal (that is, the source of the FET, or the emitter of the bipolar transistor) varies in inverse proportion to the transconductance of the feedback transistor. In other words, the impedance of the feedback transistor as seen from the output terminal of the amplifying transistor is kept at a high constant value, and the impedance of the feedback transistor as seen from the input terminal of the amplifying transistor varies in inverse proportion to the transconductance of the feedback transistor. As a result, the following effects are achieved.

(1) As described above, the transconductance of the feedback transistor is increased for a large amplitude input signal to increase the feedback amount. This will reduce the output impedance of the feedback transistor, that is, the impedance as seen from the input port of the amplifier circuit. As a result, the voltage of a large amplitude input signal applied to the amplifying transistor is limited to a low value. This achieves an increase in the maximum allowable input level and a low distortion operation.

(2) Since the input impedance of the feedback transistor is kept nearly constant, the output impedance of the amplifier circuit is also kept nearly constant. Accordingly, a variable gain amplifier circuit can be implemented in which the output matching is maintained regardless of the gain variation.

Furthermore, since the transistors (FETs in particular) have a unilateral characteristic, the signal transmission from the main current terminal to the control terminal is negligible. Therefore, the negative feedback variable gain amplifier circuit in accordance with the present invention can prevent the input signal from being transferred from the input side to the output side through the feedback circuit, thereby reducing the distortion of the variable gain amplifier circuit.

The above and other objects, effects, features and advantages of the present invention will become more apparent from the following description of the embodiments thereof taken in conjunction with the accompanying drawings.

DETAILED DESCRIPTION OF PREFERRED EMBODIMENTS

The invention will now be described with reference to the accompanying drawings.

EMBODIMENT 1

Figure 9:
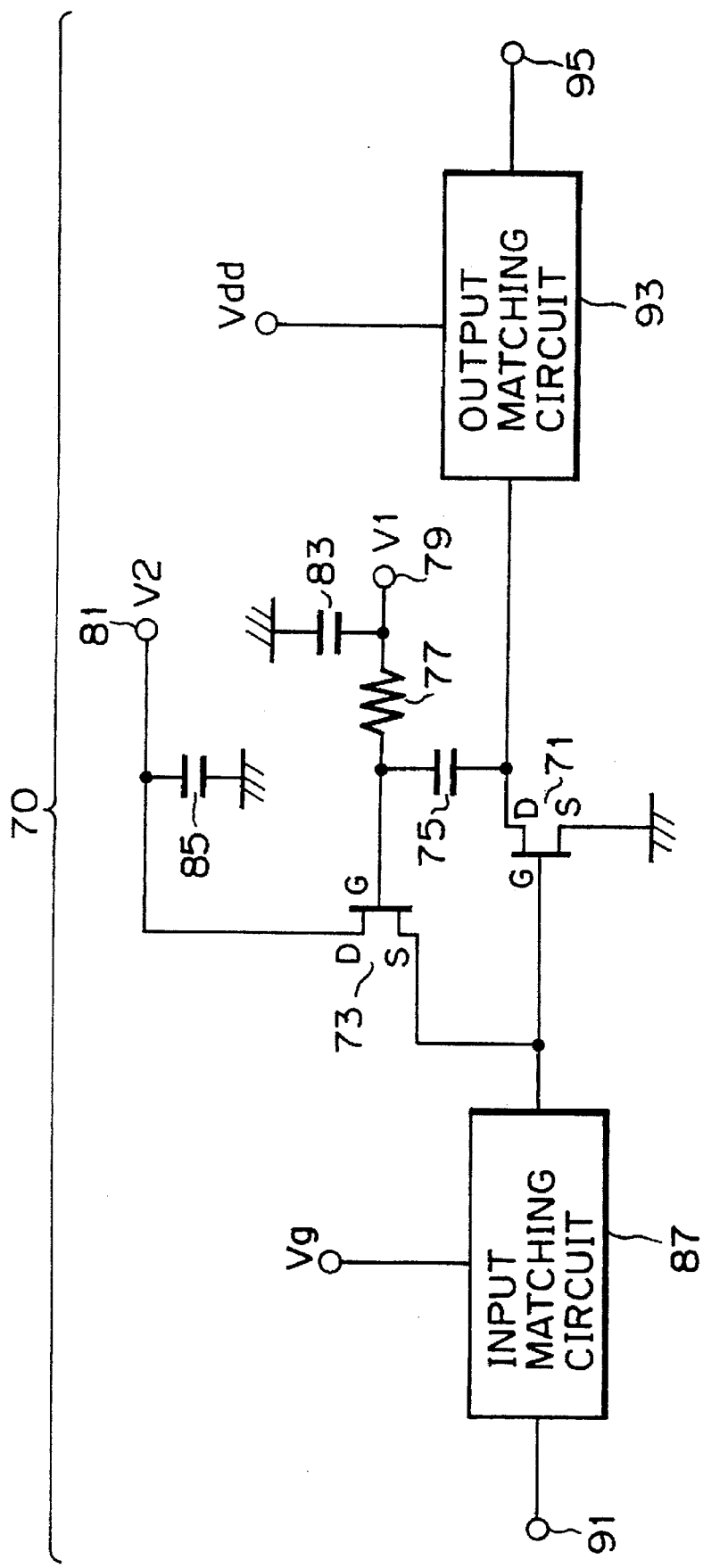
FIG. 9 is a block diagram showing a first embodiment of a negative feedback variable gain amplifier circuit in accordance with the present invention.

FIG. 9 is a block diagram showing a negative feedback variable gain amplifier circuit in accordance with the present invention. In this figure, the reference numeral 71 designates a common source FET constituting an amplifier. A feedback FET 73 is connected to the amplifying FET 71. More specifically, the source of the feedback FET 73 is connected to the gate of the amplifying FET 71, and the gate of the feedback FET 73 is connected to the drain of the amplifying FET 71 through a capacitor 75. The gate of the feedback FET 73 is further connected to a control port 79 through a resistor 77, and the drain thereof is connected to a control port 81. The control ports 79 and 81 are grounded through bypass capacitors 83 and 85, respectively. Furthermore, the gate of the amplifying FET 71 is connected to an input port 91 through an input matching circuit 87, and the drain thereof is connected to an output port 95 through an output matching circuit 93.

Figure 10A:
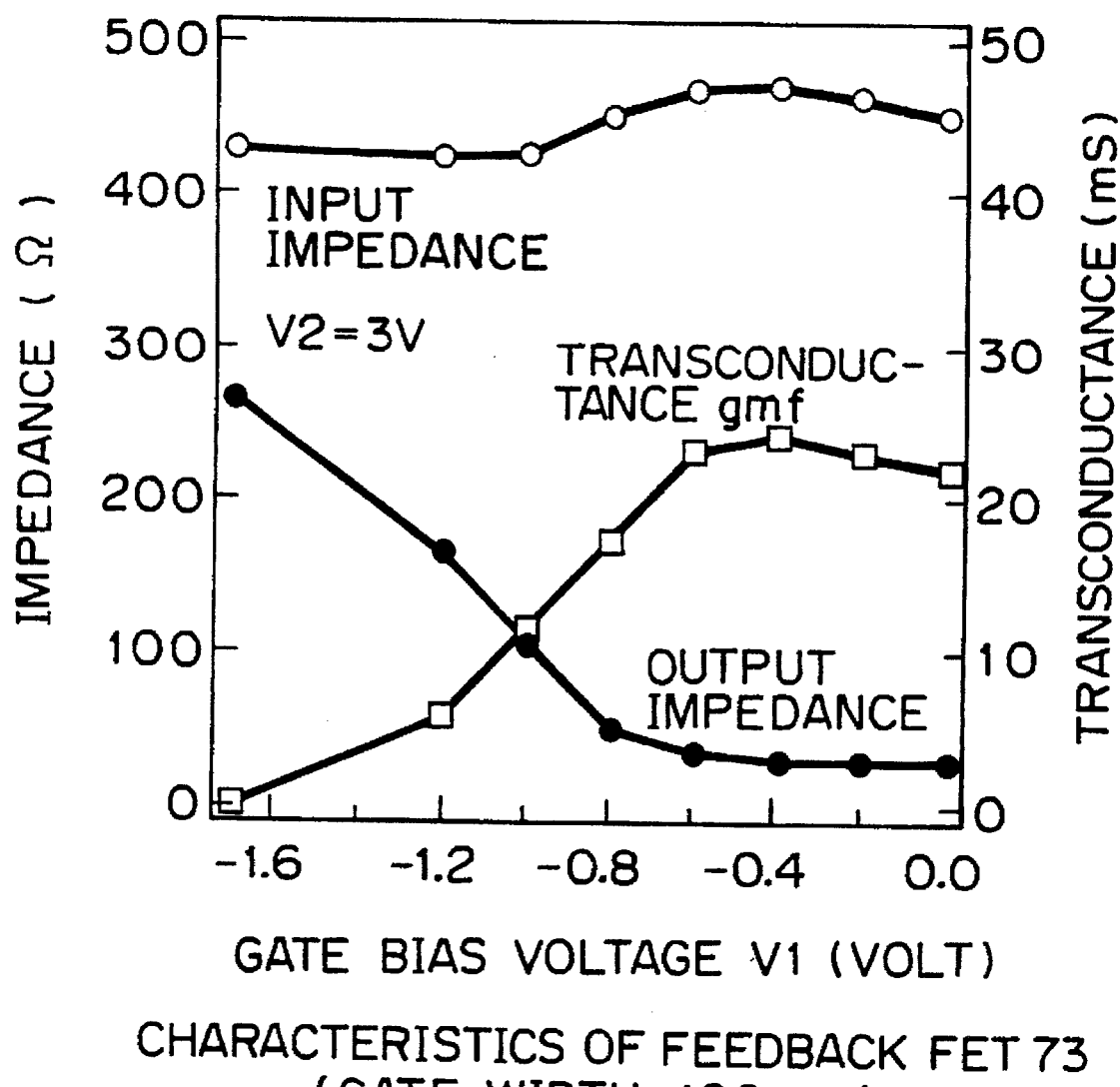
FIG. 10A is a graph illustrating the relationship between the gate bias voltage of the feedback FET of the first embodiment of the invention shown in FIG. 9, and the input and output impedances and the transconductance of the feedback FET.

With this arrangement of when the voltage V1 to the control port 79 is varied from the pinch off voltage to 0 V while maintaining the voltage V2 to the control port 81 at a fixed value (3 V in this case), the input and output impedances and the transconductance of the 100 μm gate width feedback FET 73 vary as illustrated in FIG. 10A.

More specifically, the transconductance of the feedback FET 73 gradually increases as the gate bias voltage V1 of the feedback FET 73 varies from the pinch off voltage toward 0 V, and then takes a nearly constant value beyond around −0.6 V up to 0 V. The input impedance of the feedback FET 73, that is, the gate side impedance thereof is kept nearly constant at a rather high value of about 450 ohms. The output impedance of the feedback FET 73, that is, the source side impedance thereof reduces in substantially inverse proportion to the transconductance of the feedback FET 73.

Figure 10B:
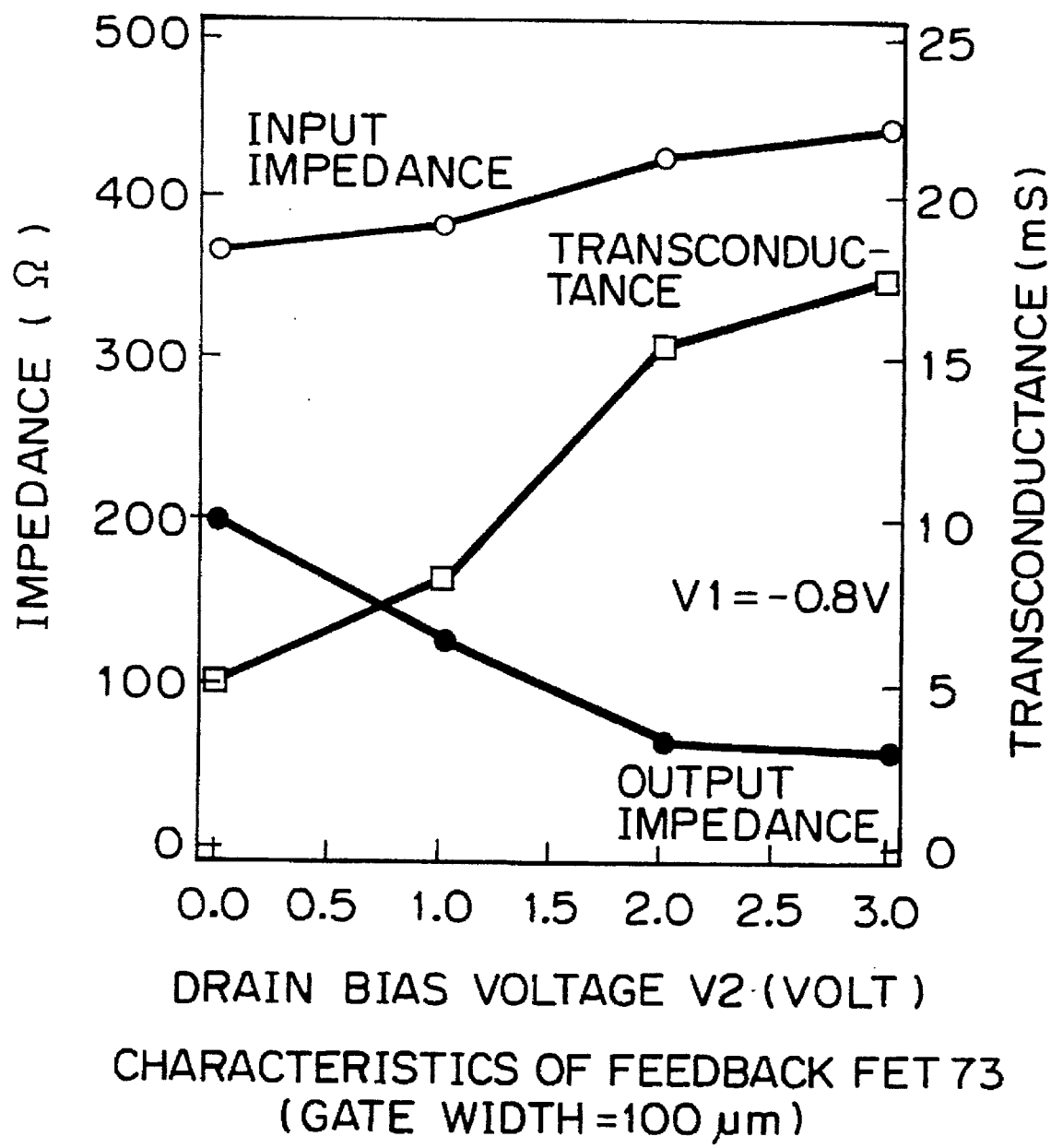
FIG. 10B is a graph illustrating the relationship between the drain bias voltage of the feedback FET of the first embodiment of the invention shown in FIG. 9, and the input and output impedances and the transconductance of the feedback FET.

On the other hand, when the voltage V2 to the control port 81 is varied from 0 V to 3 V, while maintaining the voltage V1 to the control port 79 at a fixed value (−0.8 V in this case), the input and output impedances and the transconductance of the 100 μm gate width feedback FET 73 vary as illustrated in FIG. 10B. As is shown in this figure, these values vary similarly to those of FIG. 10A wherein the control voltage V1 is varied while maintaining the control voltage V2.

Thus, the transconductance of the feedback FET 73 varies as its gate voltage or the drain voltage is varied. Accordingly, the gain of the variable gain amplifier circuit can be controlled by the gate voltage or the drain voltage. For example, deepening the gate bias voltage while maintaining the drain bias voltage will reduce the transconductance, decrease the negative feedback amount, and increase the gain of the variable gain amplifier circuit. Conversely, an increase in the gate bias voltage will raise the transconductance, increase the negative feedback amount, and decrease the gain of the variable gain amplifier circuit. Similar operations can be achieved by varying the drain bias voltage while maintaining the gate bias voltage at a fixed value. In this case, the capacitor 75 prevents the gate bias voltage from being applied to the drain of the amplifying FET 71. This enables the feedback FET 73 to be controlled independently of the amplifying FET 71.

The gain $S_{21}$ of the feedback FET 73, that is, the feedback amount of the feedback FET 73 is expressed by the following equation (1).

$$S_{21} = \frac{2Z_0 g_{mf}}{1 + Z_0 g_{mf}} \quad (1)$$

where $Z_0$ is the source side load impedance and the gate side signal source impedance of the feedback FET 73, and $g_{mf}$ is the transconductance of the feedback FET 73. As is seen from equation (1), when $Z_0$ is nearly constant, and $g_{mf}$ is much smaller than $1/Z_0$, the feedback amount increases in proportion to $g_{mf}$, and becomes approximately constant (=2) when $g_{mf}$ is much larger than $1/Z_0$.

The gain $G_{ain}$ of the variable gain amplifier circuit is expressed by the following equation:

$$G_{ain} = \frac{2Z_0 g_{m0}}{1 + (1 + Z_0 g_{m0}) Z_0 g_{mf}} \quad (2)$$

where $g_{m0}$ is the transconductance of the amplifying FET 71. As is seen from these equations, the gain of the variable gain amplifier circuit 70 increases as the negative feedback amount reduces with a decrease of the transconductance $g_{mf}$ of the feedback FET 73, and the maximum gain is obtained when $g_{mf}=0$. Conversely, the gain of the variable gain amplifier circuit 70 becomes minimum when both the $g_{mf}$ and the negative feedback amount are maximum. The parameter $S_{12}$ of the feedback FET 73 is always zero, and hence there is no signal transmission from the input side to the output side through the feedback circuit. As a result, an ideal negative feedback operation is always achieved in the negative feedback variable gain amplifier circuit in accordance with the present invention.

Figure 11:
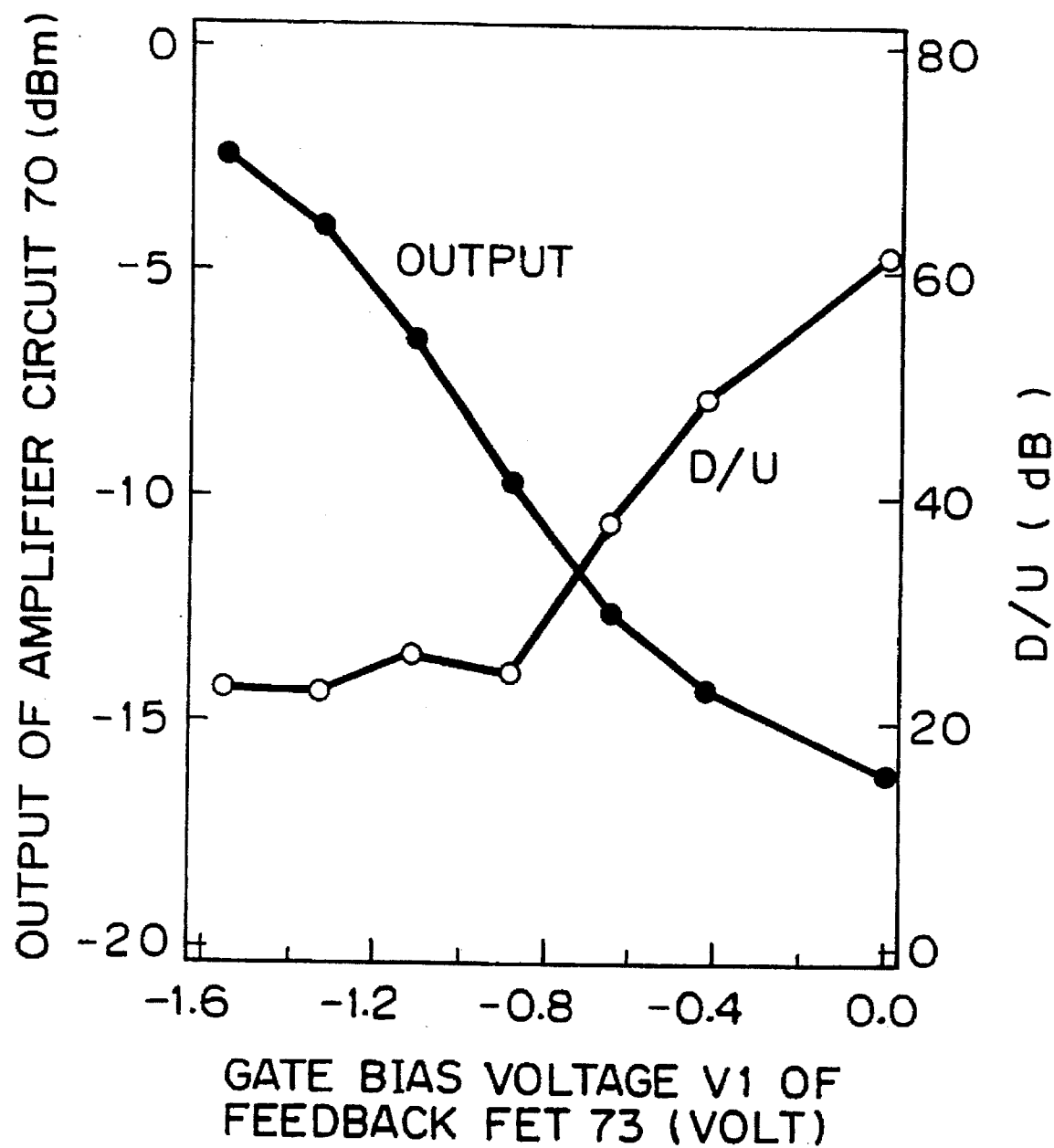
FIG. 11 is a graph illustrating the relationship between the gate bias voltage of the feedback FET in the first embodiment of FIG. 9, and the output and D/U ratio of the variable gain amplifier circuit.

FIG. 11 illustrates output level characteristics and D/U ratios of the feedback FET 73, which were obtained when the gate bias voltage V1 of the feedback FET 73 was varied in the variable gain amplifier circuit shown in FIG. 9. The D/U ratio is defined as a ratio of the output power of a desired wave D to that of an undesired wave U (a third order intermodulated wave). The measurement were carried out by simultaneously supplying the input terminal 91 with two waves whose frequencies were 4 GHz and 4 GHz+10 MHz, and whose input level was −4 dBm/tone, and by measuring the output power of the 4 GHz wave (desired wave D) and the power of the third order intermodulated wave (undesired wave U) at the output terminal 95. The gate width of the feedback FET 73 was 100 μm, the transconductance thereof was 17 mS, and the drain control voltage V2 was set at V2=3 V.

While varying the gate bias voltage V1 of the feedback FET 73 from the pinch off voltage to 0 V, the output of the variable gain amplifier circuit 70 gradually decreased from about −2.5 dB to about −16.5 dB. Considering that the input level of the desired wave D was −4 dBm, it is known that the gain of the variable gain amplifier circuit 70 varied from about 1.5 dB to about −12.5 dB, thereby providing a range of reduction of about −14 dB. On the other hand, the D/U ratio increased from 22 dB to 61 dB. From these results, it is confirmed that the gain of the variable gain amplifier circuit in accordance with the present invention can be changed by varying the transconductance of the feedback FET 73, and that low distortion operation can be carried out when the transconductance is large and the gain of the variable gain amplifier circuit is small. Thus, the variable gain amplifier circuit can achieve low distortion operation for the large amplitude input signal. Using a high performance FET with higher transconductance as a feedback FET makes it possible to achieve a greater gain variation and a higher D/U ratio.

Figure 4:
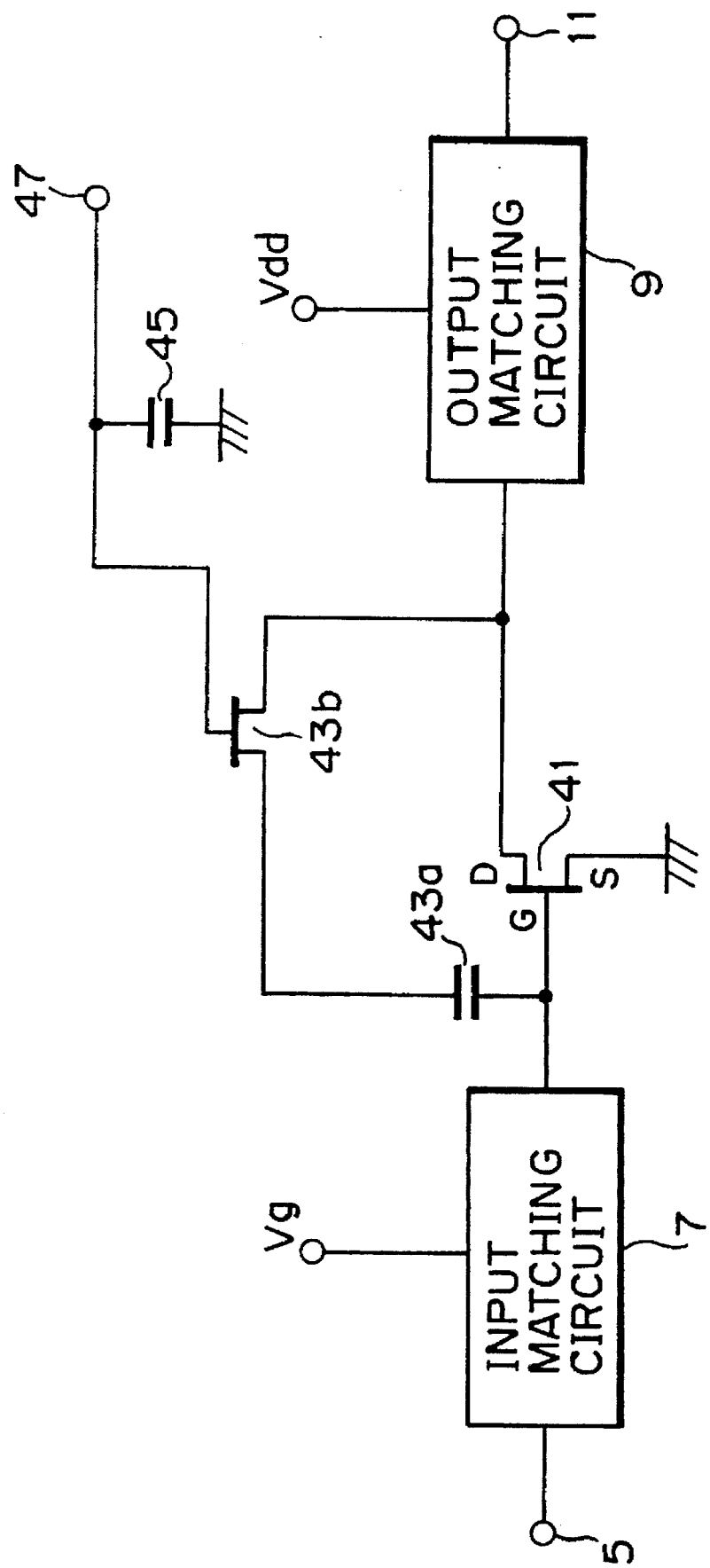
FIG. 4 is a block diagram showing an improved conventional variable gain amplifier circuit.
Figure 5:
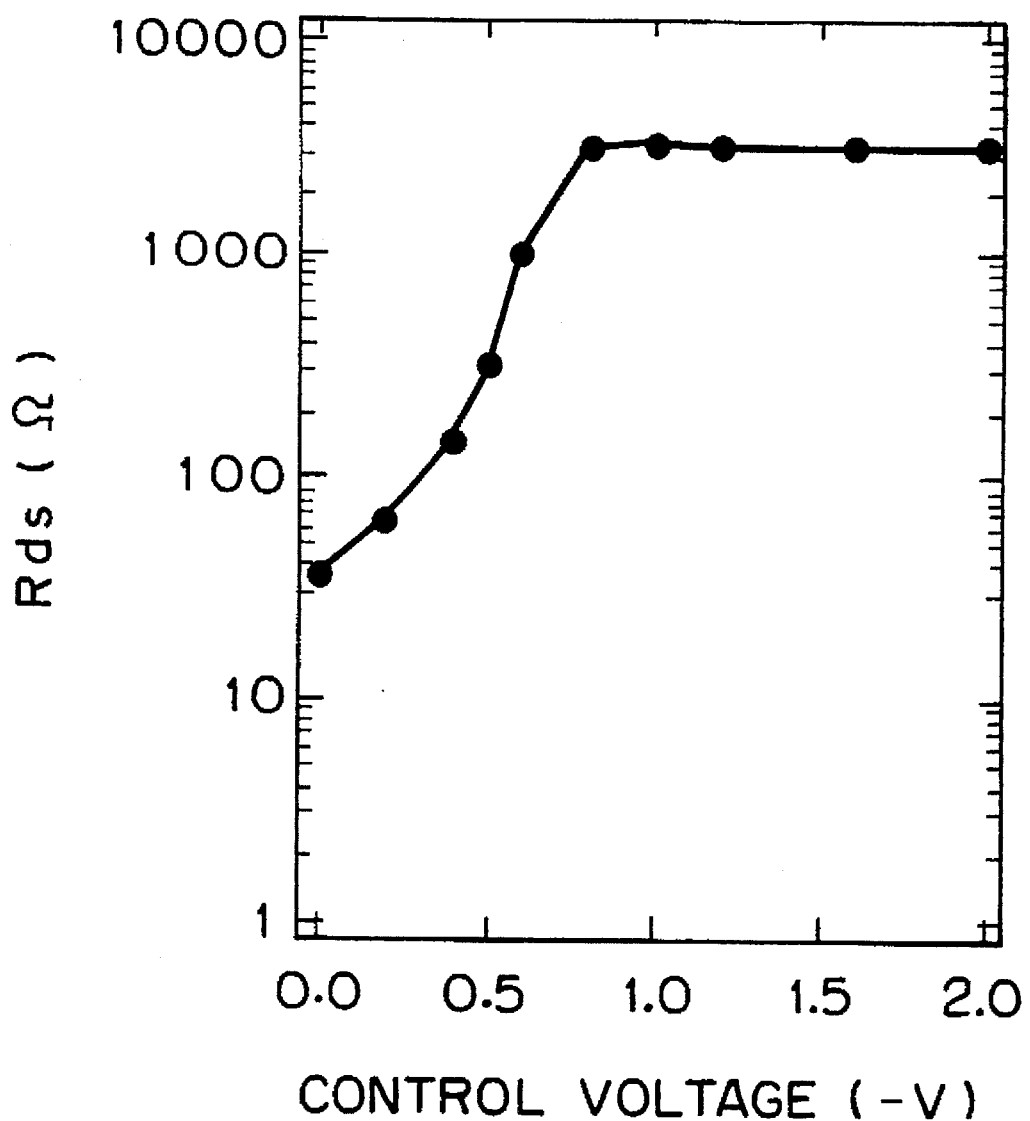
FIG. 5 is a graph illustrating the relationship between the control voltage applied to the FET 43b of FIG. 4 and its drain-source resistance Rds.
Figure 6:
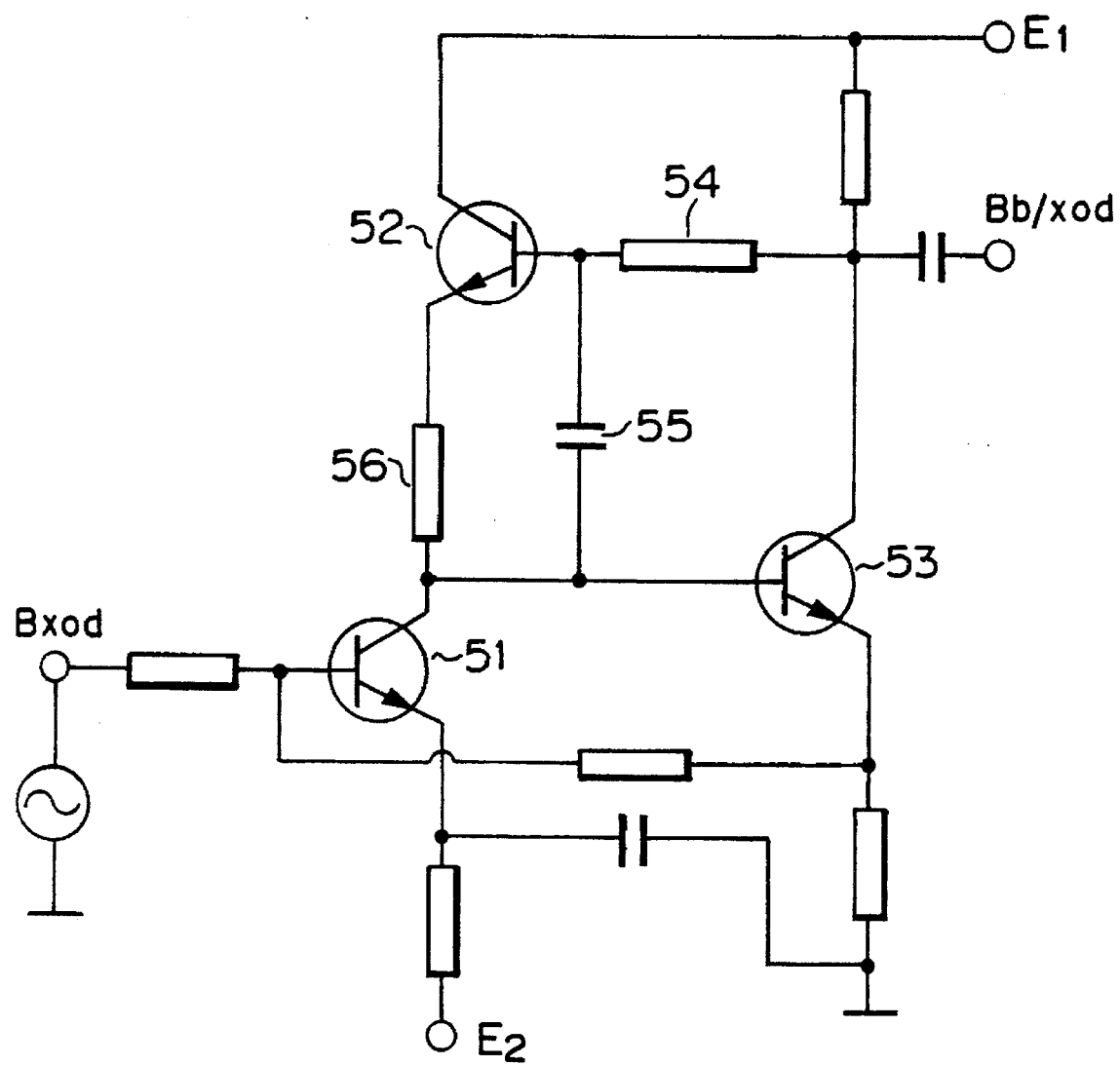
FIG. 6 is a block diagram showing a conventional negative feedback amplifier.
Figure 7:
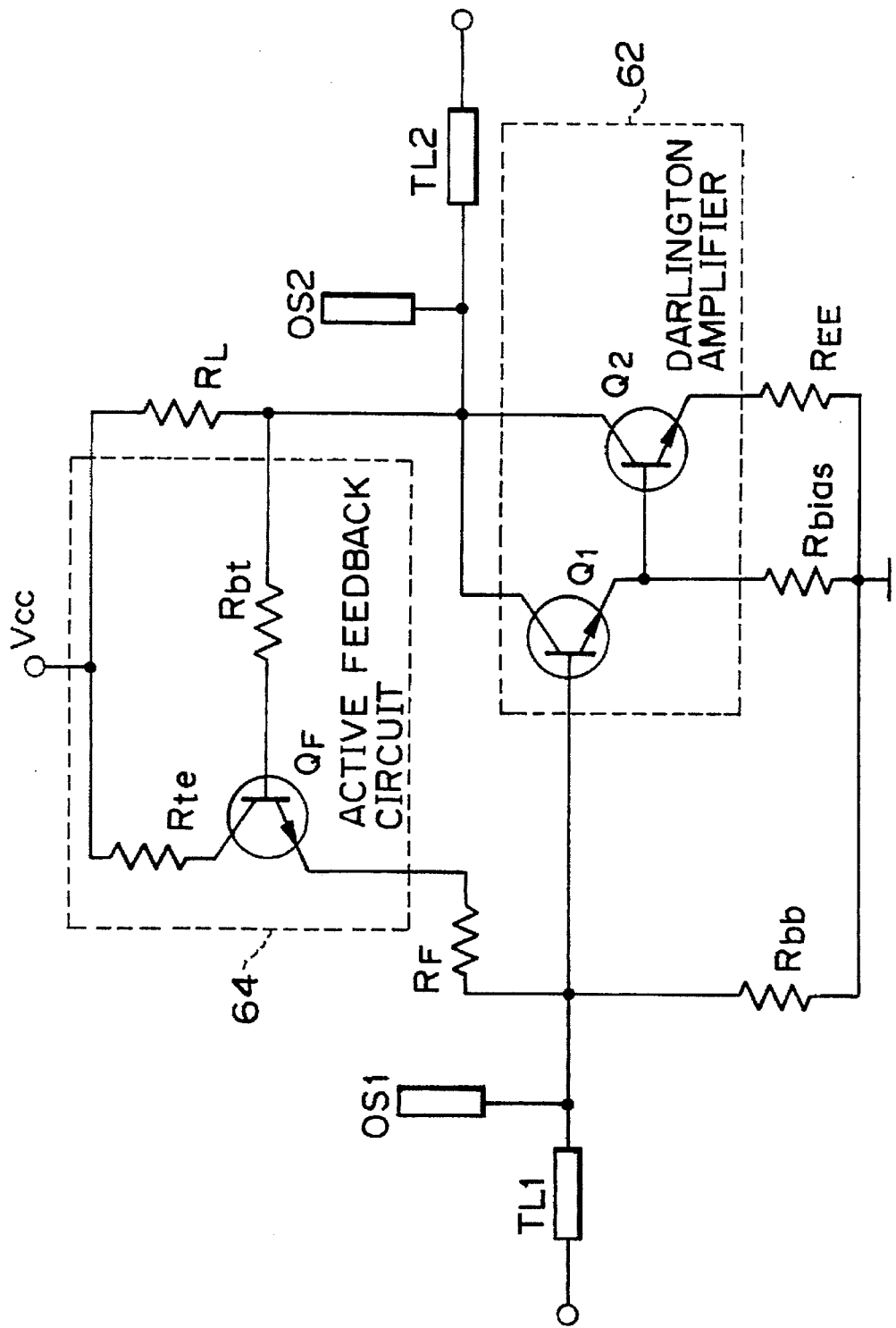
FIG. 7 is a block diagram showing a conventional negative feedback amplifier.
Figure 8:
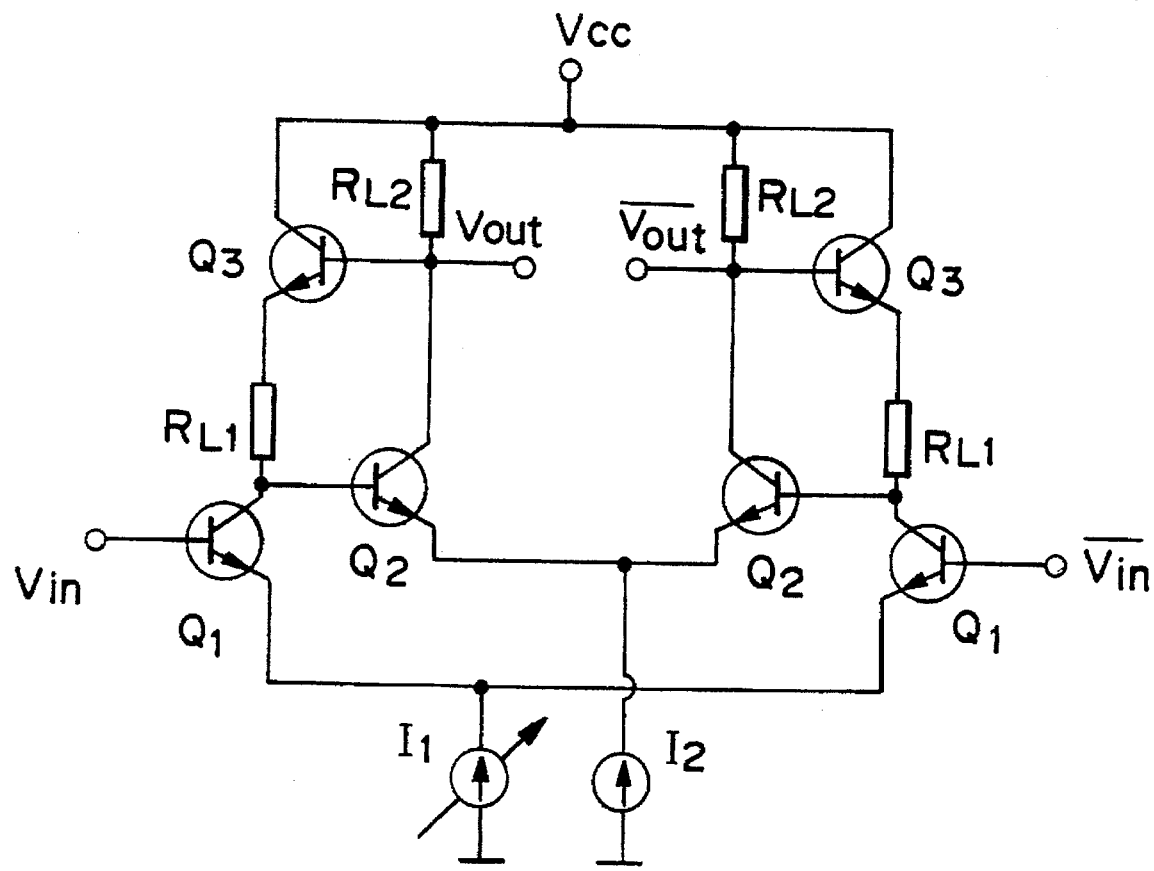
FIG. 8 is a block diagram showing a conventional negative feedback variable gain amplifier circuit.
Figure 12:
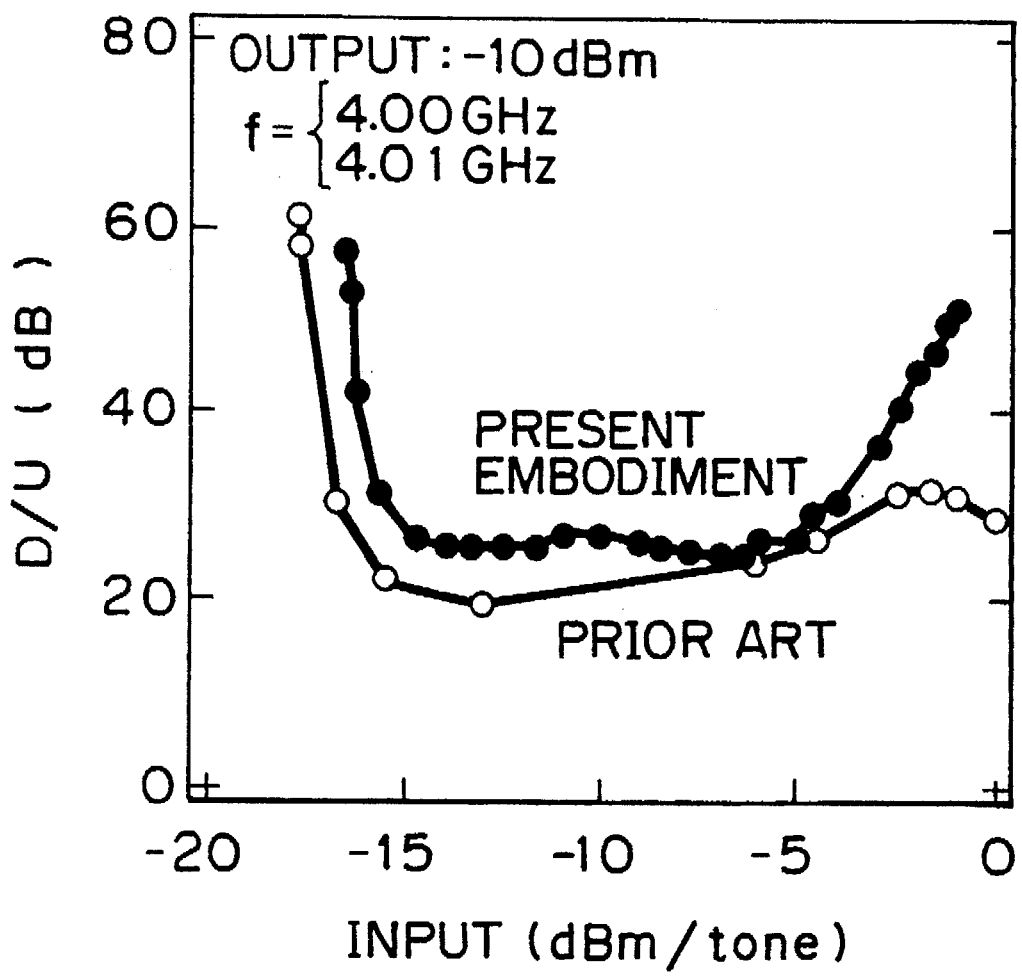
FIG. 12 is a graph illustrating the relationship between the input power and the D/U ratio when the output is kept constant in the negative feedback variable gain amplifier circuit of the first embodiment in FIG. 9.

FIG. 12 illustrates the relationship between the input power and the D/U ratio while the output of the variable gain amplifier circuit was kept constant (−10 dBm). The solid circles denote measured values in the variable gain amplifier circuit of the present embodiment, and the open circles represent measured values in the conventional variable gain amplifier circuit shown in FIG. 4. Measurement conditions were similar to those of FIG. 11. As is seen from this figure, the D/U ratio of the variable gain amplifier circuit of the present embodiment is improved as compared with that of the conventional variable gain amplifier circuit. In particular, its effect appears remarkable with regard to the input power beyond −5 dBm, and the difference between the two grows beyond 20 dB at the maximum.

Figure 13:
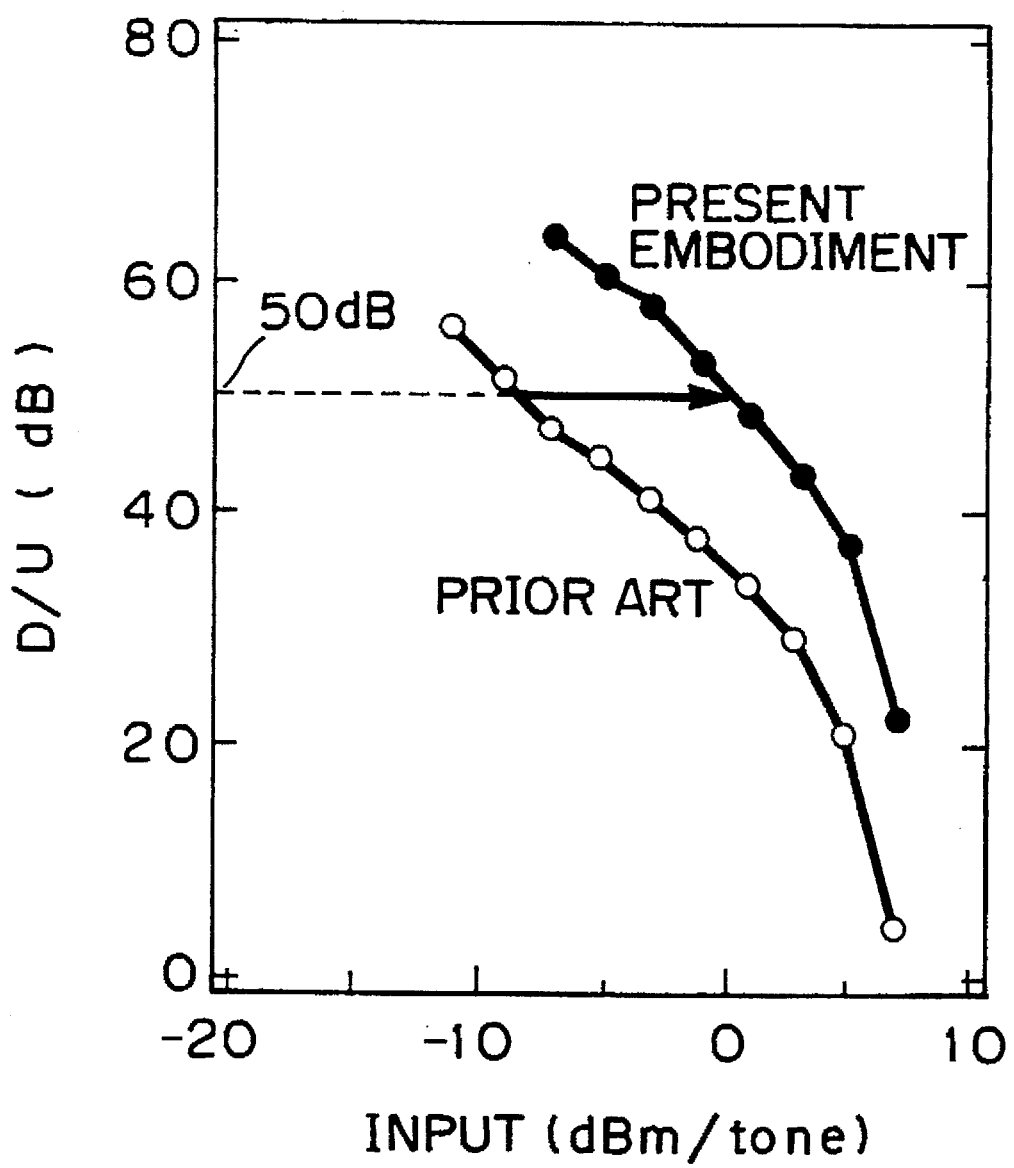
FIG. 13 is a graph illustrating the relationship between the input power and the D/U ratio when the negative feedback variable gain amplifier circuit of the first embodiment in FIG. 9 operates at the minimum gain.

FIG. 13 illustrates the input power versus D/U ratio of the variable gain amplifier circuit when its gain is minimum. The solid circles designate the characteristic of the variable gain amplifier circuit 70 of the first embodiment, and the open circles denote that of the conventional variable gain amplifier circuit shown in FIG. 4. Measurement conditions were similar to those of FIG. 11. This figure shows that the variable gain amplifier circuit in accordance with the present invention can reduce its distortion as compared with the conventional variable gain amplifier circuit. For example, the maximum allowable input level can be increased by more than 8 dB at D/U ratio =50 dB.

Thus, the maximum allowable input level of the variable gain amplifier circuit in accordance with the present invention can be increased to about 0 dBm, although that of the conventional variable gain amplifier circuit is about −10 dB, where the maximum allowable input level is defined as a maximum level at which a variable gain amplifier circuit can achieve linear operation; which corresponds to the point where D/U ratio =50 dB. The variable gain amplifier circuit with such a high linearity is implemented for the first time by the present invention.

EMBODIMENT 2

Figure 14:
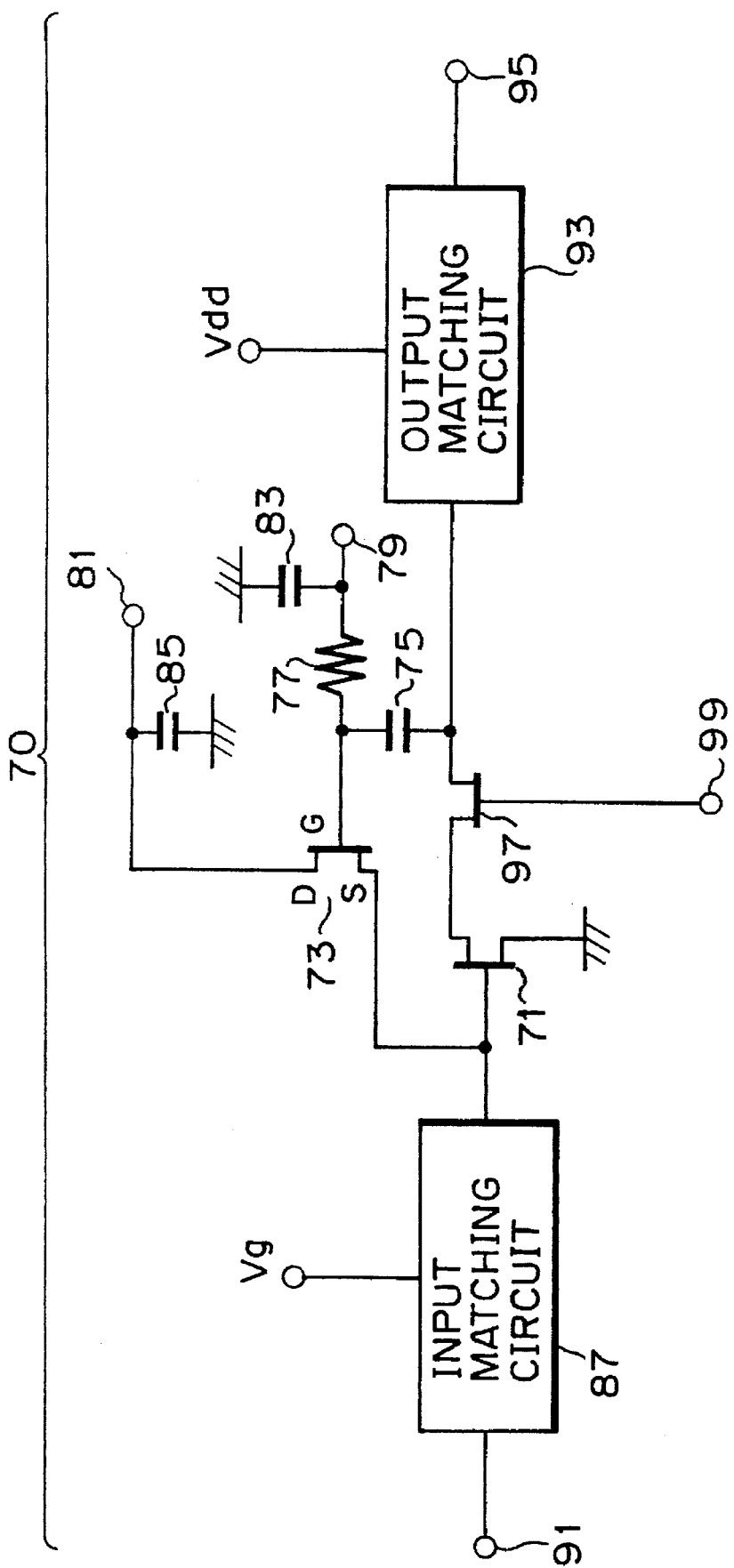
FIG. 14 is a block diagram showing a second embodiment of the negative feedback variable gain amplifier circuit in accordance with the present invention.

FIG. 14 is a block diagram showing a second embodiment of the negative feedback variable gain amplifier circuit in accordance with the present invention. The second embodiment differs from the first embodiment in that it has an active load FET 97 inserted between the amplifying FET 71 and the capacitor 75, thereby making the amplifying portion a cascode amplifier. In addition, the gate of the load FET 97 is connected to a control port 99.

Figure 1:
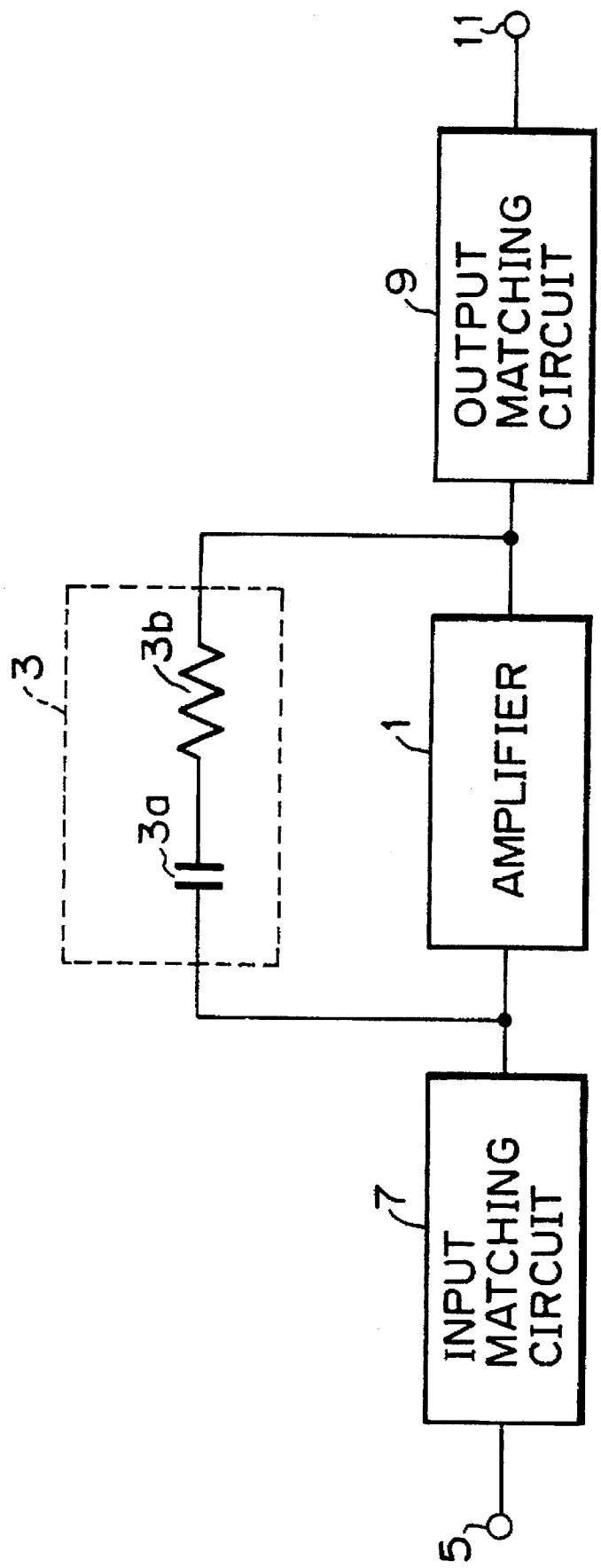
FIG. 1 is a block diagram showing a conventional negative feedback amplifier.
Figure 2:
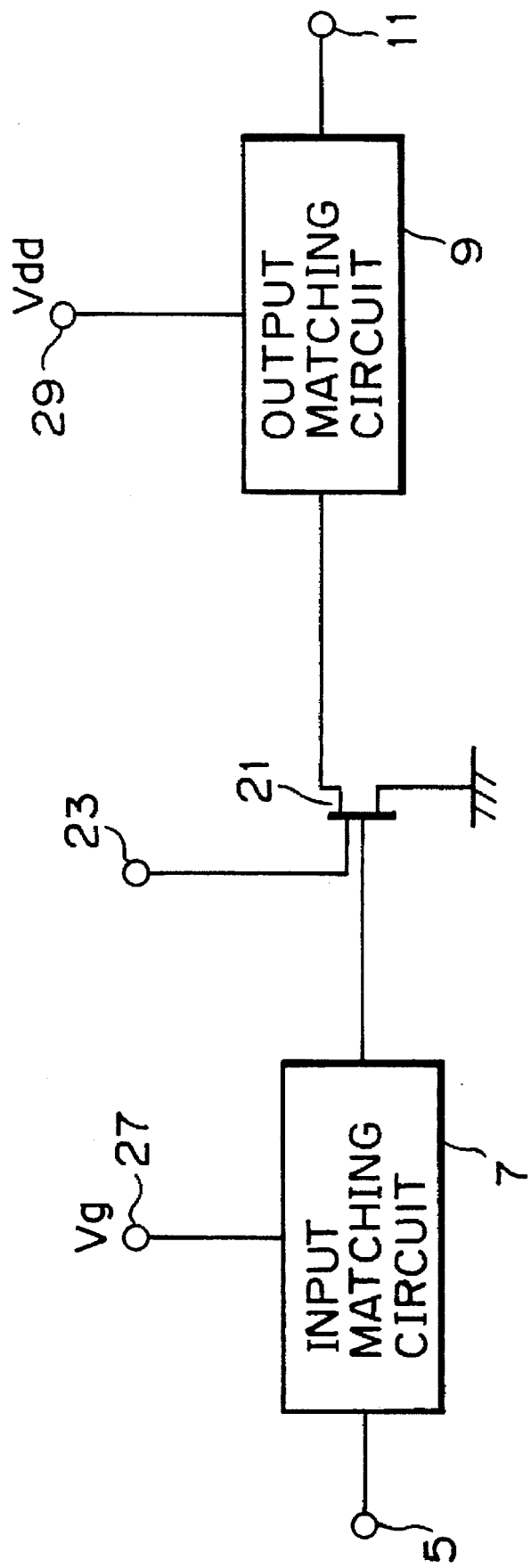
FIG. 2 is a block diagram showing a conventional variable gain amplifier circuit.
Figure 3:
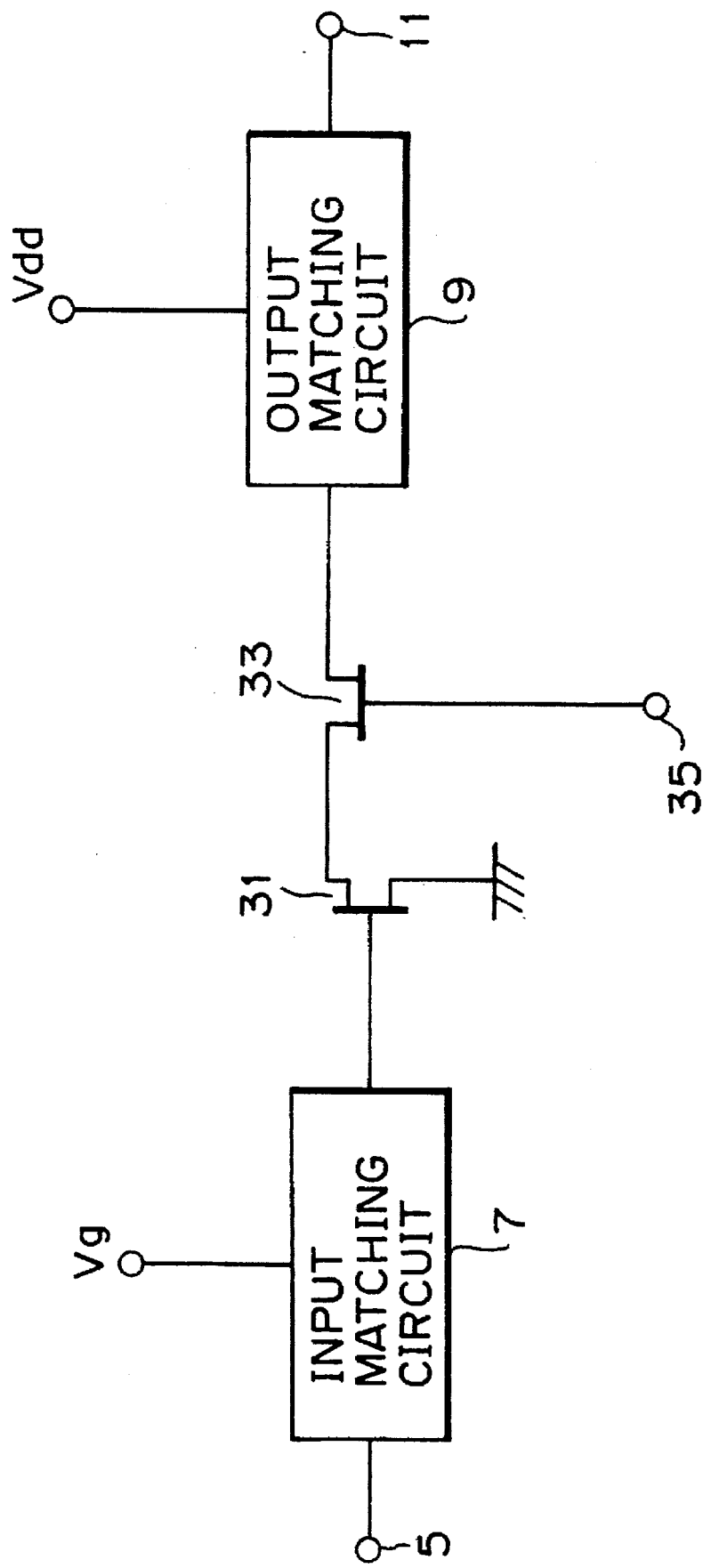
FIG. 3 is a block diagram showing a conventional variate gain amplifier circuit.

The variable gain amplifier circuit can achieve the same operation as that of the variable gain amplifier circuit of the first embodiment. Furthermore, the transconductances of the FETs 71 and 97 can be controlled by varying the voltage applied to the control port 99. Specifically, when the gain of the amplifier must be increased against a low level input signal to the amplifier circuit in FIG. 14, the voltage applied to the control port 99 is made positive so that the voltage shared to the amplifying FET 71 is increased, thereby augmenting the transconductance of the FET 71. In contrast, when the gain of the amplifier must be decreased against a high level input signal to the amplifier circuit, the voltage applied to the control port 99 is made negative so that the voltage shared to the drain of the amplifying FET 71 is reduced, and the inverse bias across the source and gate of the load FET 97 is deepened, thereby reducing the transconductances $g_m$ of both the FETs 71 and 97. Although the operation of the FET 97 itself is similar to that of the conventional circuit as shown in FIG. 3, the combination of the load FET 97 and the feedback FET 73 enables the gain control to be achieved at higher accuracy than that of the negative feedback variable gain amplifier circuit of the first embodiment.

Although FETs are used as the amplifier and the feedback circuit in the first and second embodiments, bipolar transistors or hetero-junction transistors can also be employed instead of the FETs. In this case, the bases of the transistors are substituted for the gates of the FETs, the emitters are substituted for the sources, and the collectors are substituted for the drains.

In addition, the amplifier may be replaced by a multi-stage amplifier.

EMBODIMENT 3

Figure 15:
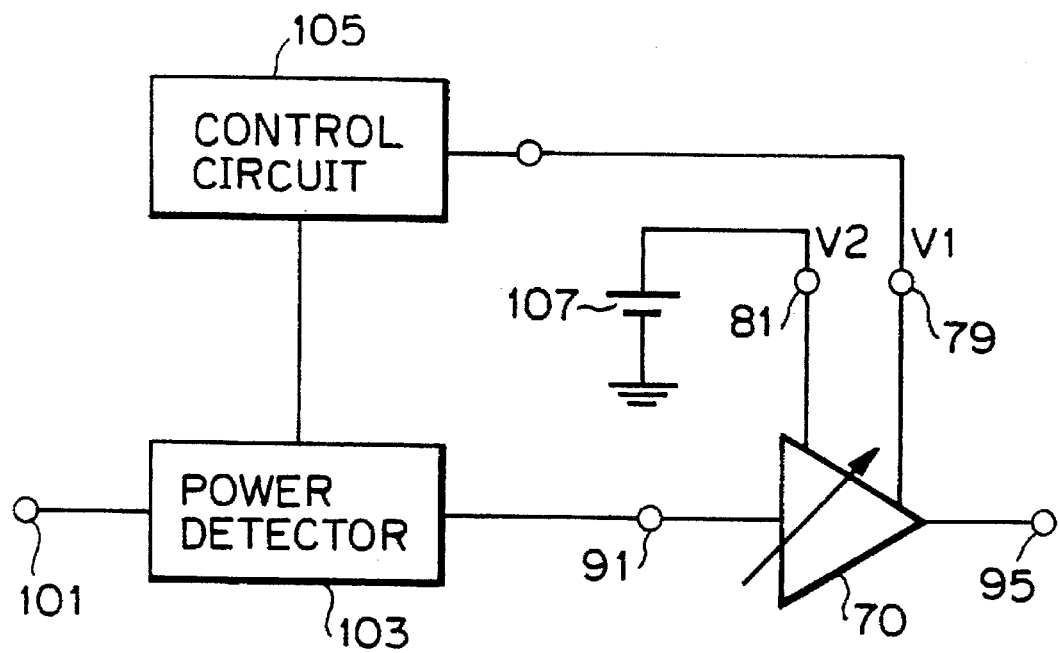
FIG. 15 is a block diagram showing a third embodiment of the negative feedback variable gain amplifier circuit in accordance with the present invention.

FIG. 15 is a block diagram showing a third embodiment of a negative feedback variable gain amplifier circuit in accordance with the present invention. This embodiment is an example in which the variable gain amplifier circuit 70 in accordance with the first or second embodiment is applied to an AGC (Automatic Gain Control) circuit.

An input signal is supplied to a power detector 103 through an input port 101 of the AGC circuit. The power detector 103 measures the power of the input signal, and provides its result to a control circuit 105. The control circuit 105 supplies the control port 79 of the variable gain amplifier circuit 70 with the control signal V1 corresponding to the input signal power. At the same time, the control port 81 is provided with a constant control voltage V2 from a fixed voltage source 107.

Combining the negative feedback variable gain amplifier circuit of the first or second embodiment as shown in FIG. 9 or 14 with the control system makes it possible to implement an AGC circuit inheriting the characteristics of the variable gain amplifier circuit.

EMBODIMENT 4

Figure 16:
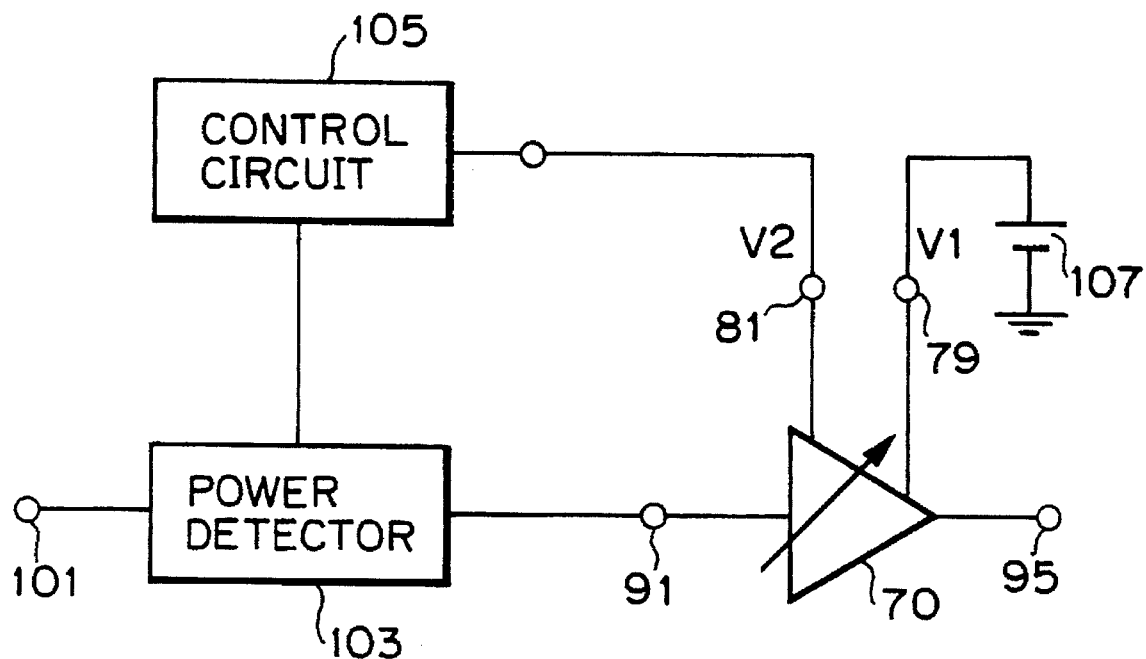
FIG. 16 is a block diagram showing a fourth embodiment of the negative feedback variable gain amplifier circuit in accordance with the present invention.

FIG. 16 is a block diagram showing a fourth embodiment of a variable gain amplifier circuit in accordance with the present invention. In this embodiment, the voltages supplied to the control ports 79 and 81 are interchanged: the control port 81 of the variable gain amplifier circuit is supplied with the output voltage of the control circuit 105, which is used as the control voltage V2; and the control port 79 is supplied with the constant voltage from the fixed voltage source 107.

With this arrangement, the transconductance of the feedback FET can be varied by the control voltage V2 as described in the first embodiment, thereby controlling the gain of the negative feedback variable gain amplifier circuit. Thus, this configuration can also implement a wide dynamic range AGC circuit.

EMBODIMENT 5

Figure 17:
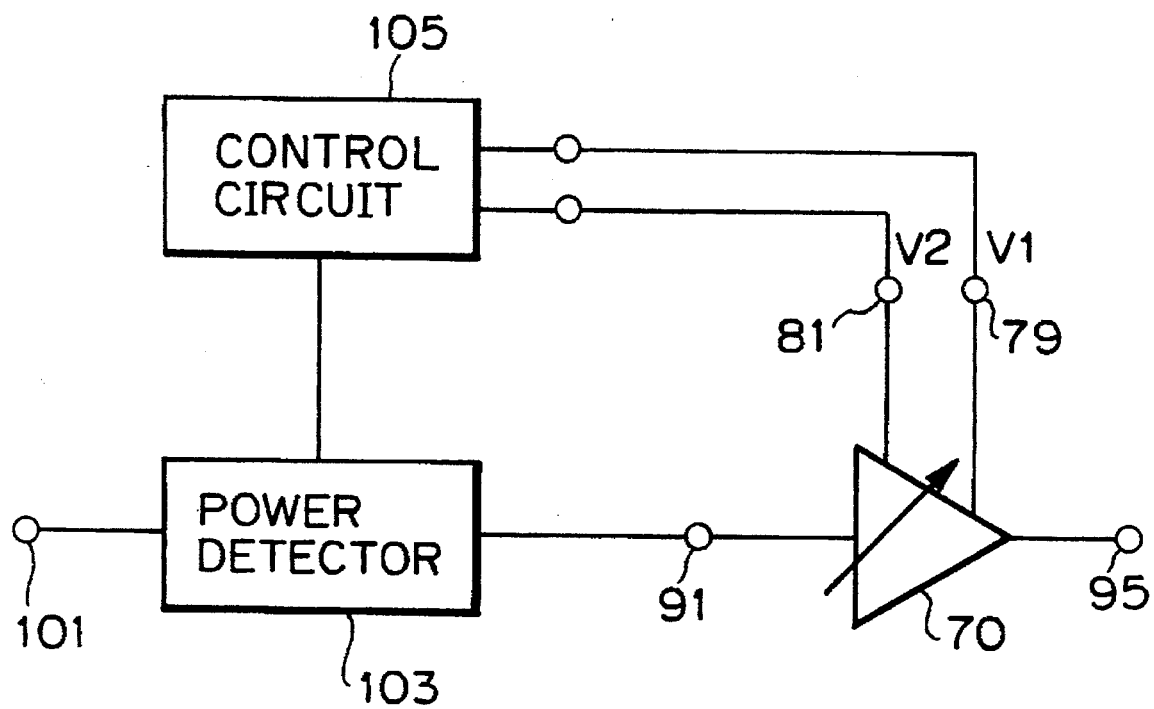
FIG. 17 is a block diagram showing a fifth embodiment of the negative feedback variable gain amplifier circuit in accordance with the present invention.

FIG. 17 is a block diagram showing a fifth embodiment of a variable gain amplifier circuit in accordance with the present invention. In this embodiment, the voltages V1 and V2 supplied to the control ports 79 and 81 are both supplied from the control circuit 105.

With this arrangement, the transconductance of the feedback FET can be varied by the control voltages V1 and V2 as described in the first embodiment, thereby controlling the gain of the negative feedback variable gain amplifier circuit. Since an intended feedback quantity can be accurately achieved by using the two control voltages, a highly accurate AGC circuit can be implemented.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A negative feedback variable gain amplifier circuit comprising:

an amplifier for amplifying an input signal;

a first port to which a first voltage is applied;

a second port to which a second voltage is applied;

a feedback transistor whose control terminal is connected to said first port, whose first main current terminal is connected to an input terminal of said amplifier, and whose second main current terminal is connected to said second port; and a capacitor connected between an output terminal of said amplifier and said control terminal of said feedback transistor, wherein said negative feedback variable gain amplifier circuit varies its gain in response to at least one of said first voltage and said second voltage.

2. The negative feedback variable gain amplifier circuit as claimed in claim 1, further comprising:

means for measuring power of an input signal to said negative feedback variable gain amplifier circuit, and for outputting a detection signal indicative of said power;

a control circuit for outputting said first voltage in response to said detection signal; and a fixed voltage source for outputting said second voltage.

3. The negative feedback variable gain amplifier circuit as claimed in claim 1, further comprising:

a fixed voltage source for outputting said first voltage;

means for measuring power of an input signal to said negative feedback variable gain amplifier circuit, and for outputting a detection signal indicative of said power; and a control circuit for outputting said second voltage in response to said detection signal.

4. The negative feedback variable gain amplifier circuit as claimed in claim 1, further comprising:

means for measuring power of an input signal to said negative feedback variable gain amplifier circuit, and for outputting a detection signal indicative of said power; and a control circuit for outputting said first voltage and said second voltage in response to said detection signal.

5. The negative feedback variable gain amplifier circuit as claimed in claim 1, wherein at least one of said first port and said second port is grounded through a capacitor.

6. The negative feedback variable gain amplifier circuit as claimed in claim 1, wherein said amplifier is a cascode amplifier.

7. The negative feedback variable gain amplifier circuit as claimed in claim 1, wherein said amplifier is a multi-stage amplifier.

8. The negative feedback variable gain amplifier circuit as claimed in claim 1, wherein said feedback transistor is an FET (Field Effect Transistor), and wherein said control terminal is a gate terminal of said FET, said first main current terminal is a source terminal of said FET, and said second main current terminal is a drain terminal of said FET.

9. The negative feedback variable gain amplifier circuit as claimed in claim 1, wherein said feedback transistor is a bipolar transistor, and wherein said control terminal is a base terminal of said bipolar transistor, said first main current terminal is an emitter terminal of said bipolar transistor, and said second main current terminal is a collector terminal of said bipolar transistor.

10. The negative feedback variable gain amplifier circuit as claimed in claim 1, wherein said feedback transistor is a hetero-junction transistor, and wherein said control terminal is a base terminal of said hetero-junction transistor, said first main current terminal is an emitter terminal of said hetero-junction transistor, and said second main current terminal is a collector terminal of said hetero-junction transistor.

11. A negative feedback variable gain amplifier circuit, comprising:

a first port receiving a first voltage;

a second port receiving a second voltage;

an amplifier having an input terminal for receiving an input signal and an output terminal for outputting an output signal;

a feedback transistor having a control terminal, a first main current terminal, and a second main current terminal, said control terminal being connected to said first port, said first main current terminal being connected to the input terminal of said amplifier, and said the second main current terminal being connected to the second port; and a capacitor connected between the output terminal of said amplifier and the control terminal of said feedback transistor, whereby the gain of the negative feedback variable gain amplifier circuit varies in response to at least one of said first and second voltages.

12. A negative feedback amplifier circuit as claimed in claim 11 wherein the second main current terminal of said feedback transistor is connected to ground through a further capacitor.

13. A negative feedback amplifier circuit as claimed in claim 12 which further comprises an input matching circuit coupled between an input port and the input terminal of said amplifier, and an output matching circuit coupled between an output port an output terminal of said amplifier.

14. A negative feedback amplifier circuit comprising:

an amplifier for amplifying an input signal;

a capacitor whose first terminal is connected to an output terminal of said amplifier; and a feedback transistor having a control terminal connected to a second terminal of said capacitor, a first main current terminal connected to an input terminal of said amplifier, and a second main current terminal grounded through a capacitor for alternating current.

15. A negative feedback amplifier circuit comprising:

a cascode amplifier for amplifying an input signal;

a capacitor whose first terminal is connected to an output terminal of said amplifier; and a feedback transistor having a control terminal connected to a second terminal of said capacitor, a first main current terminal connected to an input terminal of said amplifier, and a second main current terminal grounded for alternating current.

16. A negative feedback amplifier circuit comprising:

an amplifier for amplifying an input signal;

a capacitor whose first terminal is connected to an output terminal of said amplifier; and a feedback transistor having a control terminal connected to a second terminal of said capacitor, a first main current terminal connected to an input terminal of said amplifier, and a second main current terminal grounded for alternating current, said feedback transistor being a bipolar transistor, and wherein said control terminal is a base terminal of said bipolar transistor, said first main current terminal is an emitter terminal of said bipolar transistor, and said second main current terminal is a collector terminal of said bipolar transistor.

17. A negative feedback amplifier circuit comprising:

an amplifier for amplifying an input signal;

a capacitor whose first terminal is connected to an output terminal of said amplifier; and a feedback transistor having a control terminal connected to a second terminal of said capacitor, a first main current terminal connected to an input terminal of said amplifier, and a second main current terminal grounded for alternating current, said feedback transistor being a hetero-junction transistor, and wherein said control terminal is a base terminal of said hetero-junction transistor, said first main current terminal is an emitter terminal of said hetero-junction transistor, and said second main current terminal is a collector terminal of said hetero-junction transistor.

18. The negative feedback amplifier circuit as claimed in claim 15, wherein said amplifier is a multi-stage amplifier.

19. The negative feedback amplifier circuit as claimed in claim 15, wherein said feedback transistor is an FET (Field Effect Transistor), and wherein said control terminal is a gate terminal of said FET, said first main current terminal is a source terminal of said FET, and said second main current terminal is a drain terminal of said FET.

20. The negative feedback amplifier circuit as claimed in claim 14, wherein said amplifier is a multi-stage amplifier.

21. The negative feedback amplifier circuit as claimed in claim 14, wherein said feedback transistor is an FET (Field Effect Transistor), and wherein said control terminal is a gate terminal of said FET, said first main current terminal is a source terminal of said FET, and said second main current terminal is a drain terminal of said FET.

* * * * *